United States Patent
Rosen et al.

[11] Patent Number: 6,125,529
[45] Date of Patent: Oct. 3, 2000

[54] METHOD OF MAKING WAFER BASED SENSORS AND WAFER CHIP SENSORS

[75] Inventors: Carol Zwick Rosen, Teaneck, N.J.; Donald G. Wickham, Malibu, Calif.; John Carter, Jr.; David Sorg, both of St. Mary's, Pa.

[73] Assignee: Thermometrics, Inc., Edison, N.J.

[21] Appl. No.: 08/877,774

[22] Filed: Jun. 17, 1997

Related U.S. Application Data

[60] Provisional application No. 60/019,973, Jun. 17, 1996.

[51] Int. Cl.$^7$ ........................................ H01C 7/02
[52] U.S. Cl. .............................. 29/612; 29/25.35; 29/619; 29/621; 338/22 R; 338/225 D; 338/190
[58] Field of Search ................ 29/25.35, 25.41, 29/612, 614, 615, 619, 621; 338/22 R, 225 D, 190

[56] References Cited

U.S. PATENT DOCUMENTS

| | | | |
|---|---|---|---|
| 3,140,531 | 7/1964 | Vanik et al. | 29/25.35 |
| 3,343,151 | 9/1967 | Brown et al. | |
| 3,510,820 | 5/1970 | Jonker et al. | |
| 3,568,125 | 3/1971 | Villemant | 338/22 |
| 3,612,535 | 10/1971 | Davis et al. | |
| 3,745,506 | 7/1973 | Bethe | |
| 3,846,776 | 11/1974 | Kahn | |
| 3,876,382 | 4/1975 | Falckenberg | |
| 4,127,969 | 12/1978 | Hoshi et al. | 51/283 R |
| 4,324,702 | 4/1982 | Matsuo et al. | |
| 4,347,166 | 8/1982 | Tosaki et al. | |
| 4,519,870 | 5/1985 | Matsuzawa et al. | |
| 4,729,852 | 3/1988 | Hata | |
| 4,840,925 | 6/1989 | Rousset et al. | |
| 4,891,158 | 1/1990 | Hata | |
| 4,952,902 | 8/1990 | Kawaguchi | |
| 5,043,692 | 8/1991 | Sites et al. | |
| 5,246,628 | 9/1993 | Jung et al. | |
| 5,386,623 | 2/1995 | Okamoto et al. | 29/832 |
| 5,610,439 | 3/1997 | Hiyoshi et al. | 257/688 |
| 5,653,954 | 8/1997 | Rosen et al. | 423/594 |
| 5,830,268 | 11/1998 | Rosen et al. | 117/2 |
| 5,904,136 | 5/1999 | Nagatsuka et al. | 125/16.02 |
| 5,918,587 | 7/1999 | Hasegawa et al. | 125/23.01 |
| 5,961,944 | 10/1999 | Aratani et al. | 423/348 |
| 5,962,915 | 10/1999 | Young et al. | 257/620 |

FOREIGN PATENT DOCUMENTS

| | | |
|---|---|---|
| 742384 | 9/1966 | Canada ................................. 29/612 |
| 0 609 776 A1 | 8/1994 | European Pat. Off. |
| 0 687 656 A1 | 12/1995 | European Pat. Off. |
| 2-143502 | 6/1990 | Japan. |
| 3-136206 | 6/1991 | Japan. |
| 3-214702 | 9/1991 | Japan. |
| 3-214703 | 9/1991 | Japan. |
| 1002707 | 10/1963 | United Kingdom ................... 29/612 |
| 1002704 | 8/1965 | United Kingdom. |

OTHER PUBLICATIONS

Leonid V. Azároff, "Formation, structure, and bonding of Ni–Co–Mn oxides having spinel–type strukture," *Zeitschrift für Kristallographice*, Bd. 112, S. 33–43 (1959).

H. Makram, "Growth of Nickel Manganite Single Crystals," *Journal of Crystal Growth 1*, 1967, North–Holland Publishing Co., Amsterdam, pp. 325–326.

J. Ross Macdonald, "Impedance Spectroscopy—Emphasizing Solid Materials and Systems," pp. 1–26.

Takashi Yokoyama et al., "Formation of Mono Phase Cubic Spinel Consisting of Mn, Co and Ni Oxide and its Electrical Properties," *Journal of the Materials Science Society of Japan*, vol. 28, No. 5, 1991, pp. 271–275.

Takashi Yokoyama et al., "Influence of Firing Atmosphere on Crystal Structures of Mn–Co–Ni Oxide for Thermistor Matrerial," *Journal of the Ceramic Society of Japan, International Edition*, vol. 97, No. 4, Apr. 1989, pp. 417–422.

(List continued on next page.)

*Primary Examiner*—Lee Young
*Assistant Examiner*—Minh Trinh
*Attorney, Agent, or Firm*—Lerner, David, Littenberg, Krumholtz & Mentlik, LLP

[57] ABSTRACT

The present invention relates to making sensors by cutting pieces from a boule or ingot of a metal oxide single crystal. The sensors produced are also described.

16 Claims, 10 Drawing Sheets

OTHER PUBLICATIONS

G. Villers & R. Buhl, "Preparation, etudes cristallines at magnetiques du manganite de nickel $NiMn_2O_2$," *C.R. Acad. Sc. Paris*, t. 260, 1965, Groupe 8, pp. 3406–3409.

T. Sasamoto et al., "Crystal Structure and Electrical Property of Mn–Fe–Co–Ni Oxide For Thermistor Materials in the Manufacture Process," *Key Engineering Materials*, Trans Tech Publications, Switzerland, 1991, Vols. 53–55, pp. 101–106.

T. Yokoyama et al., "Preparation and electrical properties of monophase cubic spinel, $Mn_{1.5}Co_{0.95}Ni_{0.55}O_4$, derived from rock salt type oxide," *Journal of Materials Science*, Chapman and Hall (1995), vol. 30, pp. 1845–1848.

V.A.M. Brabers and J.C.J.M. Terhell, "Electrical Conductivity and Cation Valencies in Nickel Manganite," Department of Physics, University of Technology, Eindhonen, The Netherlands, 1982, pp. 325–332.

D.G. Wickham, "The Chemical Composition of Spinels In The System $Fe_3O_4$–$Mn_3O_4$," *J. Inorg. Nucl. Chem.*, 1969, vol. 31, pp. 313–320, Pergamon Press.

A.E. Paladino, Jr., "Phase Equilibria in the Ferrite Region of the System Fe–Ni–O," *Journal of the American Ceramic Society–Paladino*, vol. 42, No. 4, pp. 168–175.

E.G. Larson and R.J. Arnott, Preparation, Semiconduction and Low–Temperature Magnetization of the System $Ni_{1-x}Mn_{2+x}O_4$ *J. Phys. Chem. Solids*, Pergamon Press 1962, vol. 23, pp. 1771–1781.

D.G. Wickham, Solid–Phase Equilibria in the System $NiO$–$Mn_2O_3$–$O_2$, *J. Inorg. Nucl. Chem.*, Pergamon Press Ltd. 1964, vol. 26, pp. 1369–1377.

K.J. Standley, "Electrical Properties of Ferrites and Garnets," *Oxide Magnetic Materials*, Second Edition, Clarendon Press Oxford 1972, pp. 140–143.

J. Topfer, et al., "Structure, properties and cation distribution of spinels of the series $Fe_zNi_{1-z}Mn_2O_4$ ($0 \leq z \leq 2/3$)," *Journal of Alloys and Compounds*, 1994, pp. 97–103.

*Encyclopedia of Physics*, pp. 1275.

D. Stockbarger, "The Production of Large Crystals of Lithium Fluoride," George Eastman Research Laboratory of Physics, Mass. Institute of Technology, Mar., 1936, vol. 7, pp. 133–136.

W. D. Kingery, et al, "Introduction to Ceramics, Second Edition," A Wiley–Interscience Publication, John Wily & Sons, NY, pp. 61–65.

M. Yorizumi, et al., "Single Cystals of Ferrite Grown by the Floating–Zone (FZ) Method," Sony Magnetic Products, Inc., Japan, pp. 521–525.

R. Pierret, "Modular Series of Solid State Devices, Semiconductor Fundamentals," vol. I, Addison–Wesley Publishing Company, pp. 3–15.

P. W. Bridgman, "Certain Physical Properties of Single Crystals of Tungsten, Antimony, Bismuth, Tellurium, Cadmium, Zinc, and Tin." The Jefferson Physical Library, Harvard University, Cambridge, Mass., 1924, pp. 305–383.

N. Bonanos, et al., "Applications of Impedance Spectroscopy, Chapter Four," pp. 191–317.

D. G. Wickham, "The Synthesis of Ferrites and Preparation of Cobalt Ferrite Single Crystals," Thesis, pp. iii–124.

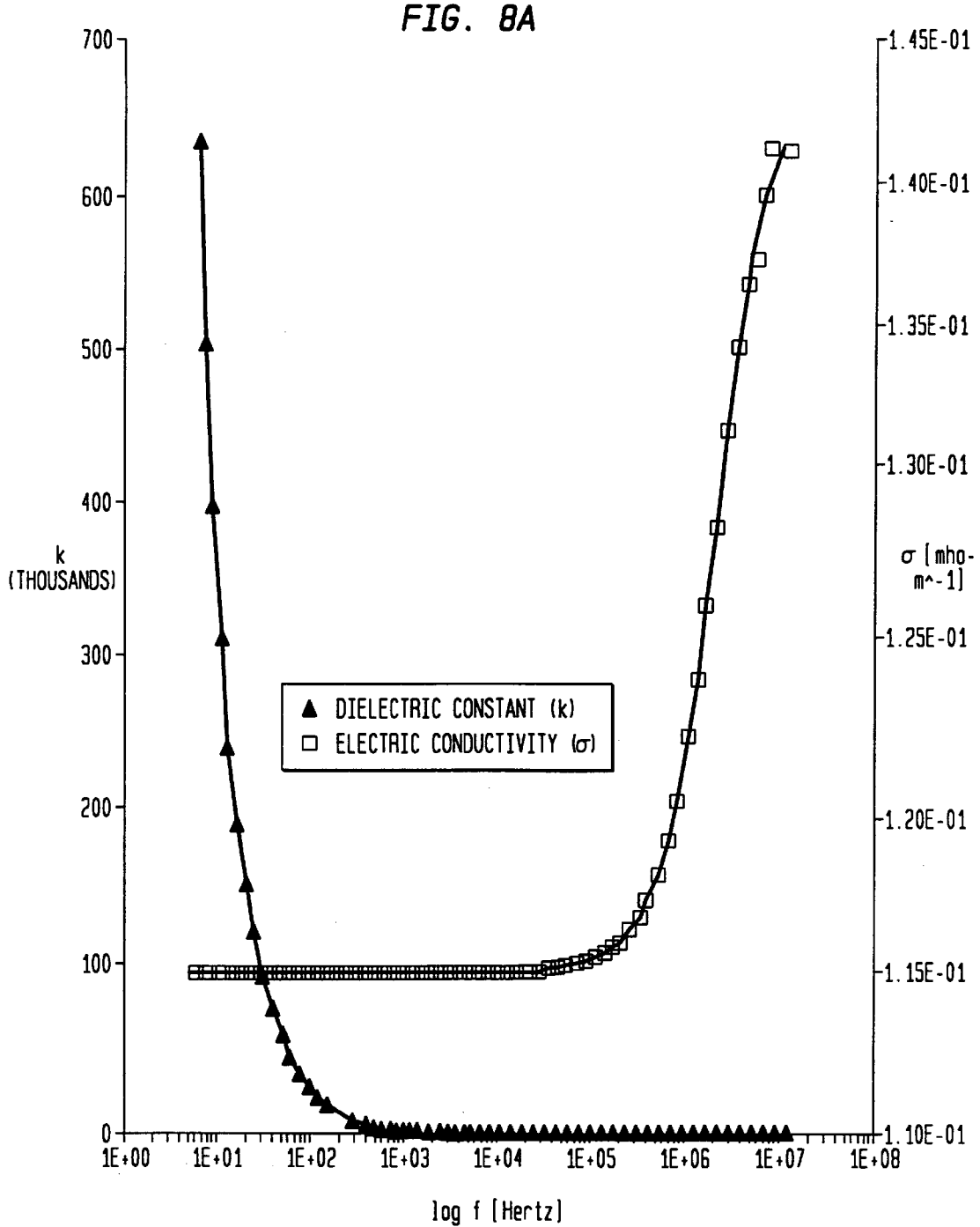

METHOD OF MAKING WAFER BASED SENSORS AND WAFER CHIP SENSORS

This patent claims the benefit of under Title 35, United States Code, § 119(e) of United States Provisional Application No. 60/019,973, filed Jun. 17, 1996.

FIELD OF THE INVENTION

The present invention relates to the field of sensing devices and methods of their manufacture.

BACKGROUND OF THE INVENTION

Thermistors are temperature sensitive electrical resistors which can be used as thermometers, temperature sensors, and temperature probes over a wide range of temperatures. Some thermistors may operate at extreme high or low temperatures exhibiting a high degree of temperature sensitivity over a specified range of temperatures. Others may be less sensitive or less able to discriminate fractional degrees of temperature, but may be operable over an even wider range of temperatures.

Most thermistors are constructed from polycrystalline metal oxide materials. These thermistors have can be formulated for wide-ranging temperature measurement and control applications. They can be small, highly sensitive and low cost. However, generally speaking, their reproducibility is poor. See Encyclopedia of Physics, 2nd Ed., Lerner and Trigg, VCH Publications, 1990, p. 1275. Monocrystalline materials, when and if available, may offer a higher degree of uniformity in terms of their physical properties, as well as a high degree of repeatability and efficiency when compared to devices made from equivalent polycrystals.

Monocrystals, as their name implies, are single crystals having highly uniform properties throughout. It is believed that the desirable properties of monocrystalline thermistors relate, at least in part, to certain characteristics of the monocrystalline state. Because monocrystals have no grain boundaries or inclusions, they will not suffer from, for example, charge carrier scattering. Further, although the behavior of any material is not predictable, because of their highly oriented structure, monocrystals are more likely to have consistent properties from one sensor to the next. Finally, when exposed to environmental conditions and changes in temperature, sensors made from monocrystals will not suffer from the accelerated aging exhibited by polycrystalline devices. Polycrystals have voids and other irregularities which can adversely affect their properties or, at very least, render their properties less reproducible from one sensor to the next. Moreover, because of the voids and irregularities inherent therein, polycrystalline based devices can absorb moisture. Therefore, aging can be accelerated when the thermistor is subjected to changing temperatures. Monocrystals could be electroded and used as sensors. However, growing single crystals of functionally equivalent size and electrical properties would be difficult in any type of mass production setting. Therefore, while monocrystals are an attractive alternative to polycrystals in some ways, actual concerns may limit the practical advantages realized.

In an unrelated art, computer chips and integrated circuits are manufactured in a variety of ways from a variety of materials. Generally, a wafer of semiconducting material is cut from an ingot, polished and then patterned with integrated circuitry and the like. The semiconducting wafer is usually made from either elements which occupy Column IV on the Periodic Table such as Si and Ge or combinations of elements in Periodic Table Columns which are an equal distance to either side of Column IV. For Example, the Column III element Ga plus the Column V element As yields a III-V semiconductor GaAs. Similarly, the Column II element Zn plus the Column VI element O yields the III-VI semiconductor ZnO. This relationship is related to the chemical bonding in semiconductors, where, on the average, there are four valence state electrons per atom. See Pierret, "MODULAR SERIES ON SOLID STATE DEVICES, Semiconductor Fundamentals", Vol. I, pages 3–15, Addison-Wesley Publishing Company (1983), the text of this reference, are hereby incorporated by reference.

Of course, in the semiconductor industry, it is a significant disadvantage that the substrate would have electrical properties that vary with temperature. In fact, if possible, those in the industry would attempt to eliminate such temperature based electrical variation as it is considered a significant disadvantage. Moreover, in producing semiconductors using this type of wafer technology, there are several factors which influence the size of the resulting material. However, the types of electrical properties important to temperature measuring are not foremost among those factors. Instead, substrates are prized for homogeneity, structural integrity and consistency of electrical properties, as well as their ability to interact with dopants or electrical circuits imprinted thereon. There are instances of using elemental materials such as carbon, germanium or silicon for temperature sensors. See Encyclopedia of Physics, 2nd Ed., Lerner and Trigg, VCH Publications, 1990, p. 1275. However, to the best of current knowledge, these sensors are composed of polycrystals.

SUMMARY OF THE INVENTION

The present invention relates to unique monocrystalline based sensors and in particular, thermistors, methods of their production and methods of their use. A boule or ingot of a material and in particular, a metal oxide can be grown and if that material is susceptible to being cut into pieces such as rods, bars, slices, plates, wafers and chips, it can be made into a thermistor. Terminals or electrical contacts can then be attached.

The materials used in accordance with the present invention are selected to emphasize the change in at least one electrical property. When the resulting sensor is to be used for measuring temperature, i.e. a thermistor, the electrical property in question is typically resistance. Materials are also selected to maximize their workability in terms of mass production. For example, the use of cubic spinel materials allows one to remove material from any portion of the device to modify size or resistance. This has a direct effect on the process of making devices from these materials. It is important to consider the size of the structure required for the end use, the ability of the resulting structure to dissipate heat, resistance and the relaxation time of the material.

Moreover, in mass production, there may be some variation in the ratio of various components from ingot to ingot. Tight process control can reduce variation, but such process control can be expensive. Moreover, it would be nearly impossible to eliminate variation entirely. To help address this, in certain aspects of the present invention, a relatively resistivity insensitive material may be used to make the ingot. In such materials, relatively large variations in composition will not have as dramatic an effect on the resistivity of the resulting material.

In either event, it is possible to compensate for compositional variation by adjusting and balancing the geometry and the resistance of the pieces cut from the ingot. Both can be accomplished by polishing, grinding or cutting material from the resulting pieces which are themselves cut from the ingot. Since semiconductor based thermistors are generally made from elemental systems, this type of variation in resistivity is not a factor and thus there is no need for such compensations. This means that the resistance can be normalized from batch to batch, even when there are compositional differences from ingot to ingot.

Normalization can also take place from piece to piece. for example, one can determine the resistivity and desired resistance for each piece. The dimensions of each piece can then be calculated. Presuming that they are within the boundary conditions of the maximum size for a thermistor for a specific purpose, the pieces can then all be cut to the same size. They will each have the same resistance. Normalizing size will yield uniform electrical properties, i.e., resistance. This is due to the inherent uniformity of the properties of a monocrystal and it represents a huge advantage.

In accordance with another aspect of the present invention, there is provided a method of producing a thermistor from a monocrystal. Preferably, the monocrystal is composed of a metal oxide, and in particular, a spinel or rock salt structured material. Most preferably a cubic spinel monocrystal of a metal oxide is used. The method includes the step of providing an ingot of monocrystalline material. The ingot is then sliced into at least one piece. The resulting piece has at least one edge of a predetermined thickness and at least one major planar surface having an area. The thickness of the piece and the area of the major planar surface are generally preselected to have preferably, at least a predetermined amount of an electrical property such as, for example, resistance. A first terminal is then attached to the piece and a second terminal is attached as well. The second terminal is attached to the piece at a location spaced apart from the first terminal. The result is a monocrystalline metal oxide thermistor.

In a preferred embodiment, the size of the piece may be further adjusted by removing some of the metal oxide material to further modify the electrical properties of the device so as to bring it into specifications with other pieces from the same, or a different boule. Specifically, it is possible to modify the resistance of, for example, a wafer, by reducing either its thickness or the area of the major planar surface thereof. This is particularly important in the context of the mass production of thermistors from an ingot. The resistivity of the material may be known or may be determined. The ingot can then be sliced and the resulting slice, piece or wafer will have a different resistance than the ingot. However, it will retain the same resistance/temperature characteristic (sensitivity, the percentage change in resistance with change in temperature.) If the wafer is of the desired size and resistance, then no further treatment may be needed. If the resistance is close, then polishing or grinding the edges or a major planar surface may remove just enough material to bring the overall resistance into compliance with the desired specification.

In another preferred embodiment, it may be desirable to further process the piece or slice cut from the ingot to produce a plurality of chips, bars or the like. This too will have the effect of modifying the resistance of the system by providing one or more smaller pieces of the ingot each having a total resistance which is different than that of the slice. This can be accomplished by cutting the slice with one or more additional cuts generally along a plane perpendicular to the major planar surface. The resistance of each of the resulting chips can then be further reduced to within tolerance by grinding, polishing and cutting additional material therefrom. The cutting of a slice or wafer into chips can be accomplished either before of after contacts or terminals are applied.

The methods of the present invention preferably include the step of growing or producing an ingot in an oxygen containing atmosphere. This means that a totally new set of parameters must be considered such as the use of temperatures of 600° C. or above in combination with an oxygen containing atmosphere. In fact, temperatures of about 1,000° C. or above may be used. This is in sharp contrast to the production of most semiconductors where careful steps are taken to exclude oxygen. The present invention also involves the careful preselection of materials which are useful in a mass production context. This manifests itself in the material provided as an ingot as part of a process of producing wafers or chips thereof as well as the selection of materials for growing a boule.

Temperature sensitive thermistors, and indeed other types of sensors, produced in accordance with these methods are also contemplated. Preferably, these sensors include a piece of monocrystalline material cut from an ingot. More preferably, the ingot is composed of a metal oxide material and even more preferably, a material having a cubic spinel or rock salt structure. The resulting piece, slice, wafer, bar or the like will have a predetermined thickness and at least one major planar surface having an specific area. Most preferably, the ingot is cut to produce a piece having both a desired size, generally a maximum size, as well as a desired electrical property such as resistance. A first terminal is attached to the piece of monocrystalline material and a second terminal is attached at a location spaced apart from the first terminal. The sensors may also include a housing or support in intimate contact with the piece of monocrystalline material. The piece of monocrystalline material can be mounted in or on the housing. Leads may also be attached to each of the terminals or contacts.

A method of producing a sensor from a monocrystal having certain advantageous quality control aspects is also contemplated. In accordance with this aspect of the present invention an ingot of a monocrystalline material, and preferably a metal oxide is provided. This ingot is then analyzed for imperfections. Presuming that none are found, or that any imperfections can be cut away, that portion of the ingot without imperfections can then be sliced into at least one piece. Preferably, the method of analysis used is impedance analysis or impedance spectroscopy. In an alternate embodiment, the structure of a piece cut from the ingot can be checked to confirm that no adverse structural consequences resulted from slicing. This can be done instead of, or in addition to, analysis of the boule.

In another alternate embodiment, the method includes the step of providing an ingot of monocrystalline material and slicing the ingot into at least one piece. Next, a first terminal is attached to at least a first portion of the cut piece and then a second terminal is attached to at least a second portion of that cut piece at a location spaced apart from the first terminal. Finally either the piece is analyzed for imperfections or for contact imperfections at the terminals. Quality control can also involve accurately confirming the size and geometry of each piece. If the size and geometry are consistent, the electrical properties will be consistent as well.

The thermistors produced in accordance with the present invention can be used to determine temperatures or changes in temperature. The thermistor is placed in electrical contact with a device which can determine a change in at least one electrical property of the thermistor as the temperature of the thermistor changes. Generally the change in resistance of the material is measured. The temperature of the thermistor is then changed. This occurs by exposing the thermistor to an environment having a different temperature than the thermistor. Preferably, the material and the resistivity of the thermistor are preselected to provide the maximum change in resistance when the thermistor is exposed to temperatures within the specific range of temperatures of interest. Finally, the change in at least one electrical property of the thermistor, i.e., a change in resistance with temperature is determined and correlated to the temperature of the thermistor and the environment to which it is exposed.

The present invention provides a cost effective and efficient way of producing sensors having the advantageous properties of monocrystalline oxide materials. The present invention also allows for the mass production of sensors having a previously unparalleled level of consistence and repeatability. The sensors produced may be uniform in size and propertied to a degree not previously obtainable. This not only provides a cost savings to both the manufacturer and user, but also assures the end user of a high level of comparability, uniformity and repeatability, from sensor to sensor.

BRIEF DESCRIPTION OF THE DRAWINGS

FIG. 8a is a plot of Dielectric Constant (K=ϵ/ϵ$_0$)) (closed triangles) and Electric Conductivity (σ) (open squares) [mho-m$^{-1}$] versus log Frequency [Hertz] for the monocrystal at −4° C.

DETAILED DESCRIPTION OF THE PREFERRED EMBODIMENT

Figure 1:
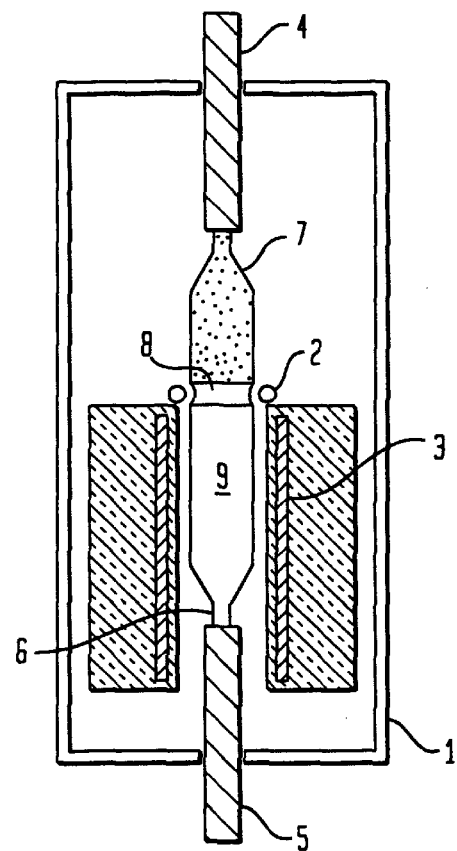
FIG. 1 is a diagram of a modified floating zone apparatus used for growing ingots illustrating the growth of an ingot.

A "sensor" in accordance with the present invention can be used for measuring, moisture, humidity, dewpoint, etc. However, the preferred sensors in accordance with the present invention are thermistors. A "thermistor" in accordance with the present invention is a device whose electrical properties vary as the temperature of the thermistor material changes. Of course, that is true of many materials. However, thermistors are produced from materials which preferably provide a change in their electric properties in a highly incremental, accurate and predictable manner, over at least a set range of temperatures. Preferably, large changes in a measurable electrical property are preferred. Certain thermistors, based on their structure and composition, may be highly useful over a relatively narrow range of from, for example, 100 to 150° C. However, the same thermistors may be highly sensitive. Other thermistors may be useful over a wider range of temperatures of from, for example, −100° C. up to 500° C. However, these same thermistors may be less sensitive. Of course, it is most preferred to have a thermistor which is capable of highly accurate temperature indication over as broad a range of operating temperatures as possible.

For these reasons, the selection of materials and designs may vary significantly with the intended application. The range, specificity and accuracy of a sensor and, consequentially, probes or sensors produced therefrom, depend on a number of factors. Principally, however, the properties of a thermistor are dependent upon the their resistance and temperature characteristics, which are themselves dependent upon the properties of the materials from which they are produced. In accordance with the present invention, thermistors are produced from monocrystalline material. As used herein, "monocrystalline" means that the material is a single crystal as opposed to an amorphous material or a polycrystalline material.

In the production of traditional semiconductors, it is desirable to ensure that oxygen is eliminated. In accordance with the present invention, however, the materials used are metal oxides of nickel, manganese, cobalt, iron, copper, titanium, chromium, along with lithium, magnesium, aluminum, scandium, vanadium, zinc, gallium, germanium, zirconium, niobium, molybdenum, ruthenium, rhodium, palladium, cadmium, indium, tin, antimony, tantalum and tungsten or combinations of these.

Preferably, the material used is a compound of mixed metal oxide including oxygen and at least two of the aforementioned metals. A number of preferred formulations are illustrated in Table 1.

TABLE 1

| Composition Type (M) | Atomic weight[b] (O = 15.9994) | | | | | | | Formula | | |
|---|---|---|---|---|---|---|---|---|---|---|
| | 58.69 Ni | 58.93320 Co | 58.93805 Mn | 55.847 Fe | 63.548 Cu | 51.9961 Cr | 47.88 Ti | Weight $M_3O_4$ | R = Mn/3 | Atoms in $M_3O_4$ |
| (Ni—Mn) Type | | | | | | | | | | |
| 1 | 1.00 | — | 2.00 | — | — | — | — | 232.56 | 0.667 | $Ni_{100}Mn_{200}O_4$ |
| 2 | 0.6031 | — | 2.3969 | — | — | — | — | 231.07 | 0.799 | $Ni_{603}Mn_{2397}O_4$ |
| 3 Substituted (Ni—Mn) Type | | | | | | | | | | |
| 4 | 0.9796 | — | 1.9896 | 0.02108 | — | 0.0097983 | — | 232.48 | 0.663 | $Ni_{.980}Mn_{1990}Fe_{.021}Cr_{.0098}$ |
| 5 | 0.9841 | — | 1.9682 | — | — | — | 0.04770 | 232.17 | 0.656 | $Ni_{984}Mn_{1968}Ti_{048}O_4$ |
| 6 | 1.0530 | — | 1.7433 | — | — | — | 0.2037 | 231.32 | 0.581 | $Ni_{1053}Mn_{1743}Ti_{204}O_4$ |
| (NiMnCo) Type | | | | | | | | | | |
| 7 | 0.467 | 0.934 | 1.600 | — | — | — | — | 234.30 | 0.533 | $Ni_{417}Co_{934}Mn_{1600}O_4$ |
| Substituted (NiMnCo) Type | | | | | | | | | | |
| 8 | 0.3856 | 0.7708 | 1.3203 | — | 0.5232 | — | — | 237.84 | 0.440 | $Ni_{306}Co_{771}Mn_{1320}Cu_{523}O$ |

Preferably, the material used has a crystal structure which is either a spinel or a rock salt. "Spinel" refers to a specific crystal structure which can be formed from a number of oxides of the general formula $M_3O_4$ such as, for example, magnesium aluminate $MgAl_2O_4$ and nickel manganite, $NiMn_2O_4$. Although there are a number of spinel geometries, all of which are useful in accordance with the present invention, preferred is the cubic spinel structure. See W. P. Kingery, "Introduction To Ceramics", 2nd Edition, 1976, by John Wiley & Sons, Inc. of New York and in particular, pages 64 and 65 thereof. The text of Kingery is hereby incorporated by reference.

Rock salts are substances which crystallize with the structure of NaCl (which is rock salt). Many halides and oxides crystallize in a cubic rock salt structure. Oxides having the rock salt structure are, for example, MgO, MnO, CoO and NiO. (See Kingery p.61). In this geometry, the large anions are arranged in cubic close packing and all of the octahedral interstitial positions are filled with cations. Rock salts and cubic spinel crystals exhibit isotropic properties when compared to crystals of other geometric configurations. Therefore, transport processes such as electric conductivity are equal in all three axes of the crystal. This makes it easy to adjust their properties by the removal of material along an X, Y, or Z axis.

The amounts of individual components of the monocrystalline material can vary widely and will change depending upon the properties of the desired crystal, the components used and the like. A more complete discussion of the ability to vary the proportions of components in a single crystalline material useful for a thermistor can be found in Thermometrics application Ser. No. 08/485,851 filed Jun. 7, 1995. The text and drawings of the application are hereby incorporated by reference. While the system described therein was a NiMnO system, the same factors must be considered in formulating other crystalline materials in accordance with the present invention. See also Rosen et al. Attorney Docket No. Thermometrics 3.0-010 entitled Nickel Cobalt Manganese Crystal filed on the same date as this application, the text and drawings of which are hereby incorporated by reference.

Generally, the exact compositions are not as important as are the resulting properties. The material must be capable of being used as a sensor or thermistor, grown as a single crystal ingot. Preferably, the materials will be mixed metal oxides having spinel or rock salt structure. The material must be able to withstand the forces applied during slicing and further processing. It is this latter issue which was completely unknown. In fact, many still do not believe that a mixed metal oxide monocrystal can be sliced and diced. Most importantly, it must be able to provide a highly predictable, incremental and pronounced change in at least one electric property such as resistance over at least some ascertainable range of temperatures in a highly repeatable manner. When the devices produced from the ingot are used as sensors for something other than temperature, such as moisture sensors, it is transport processes and dielectric effects which must be measured, not just DC resistance. However, the need for relatively large changes in a highly repeatable manner remains constant. It has been found that metal oxide monocrystals can meet all of these requirements.

There is one other aspect of the composition which bears further discussion. As previously noted, temperature range over which a thermistor can operate and the sensitivity of the thermistor are, in large measure, a function of the material selected. Some metal oxide systems are very sensitive to changes in composition and, as the ratio of the components change, so to will the Beta, the resistivity and the temperature range and sensitivity of the resulting thermistors. These systems may be very useful because they allow one to tailor the temperature range and sensitivity to suit the end use. However, these same systems pose a challenge in mass production. It may be difficult and/or expensive to provide boules of exactly identical compositions and ratios each and every time. Therefore, the use of very sensitive crystal systems could introduce processing variables or variations in properties. Other systems, systems which are relatively resistivity insensitive, are much better for use in the mass production of boules and sensors in accordance with the present invention. In such systems, variations in the relative proportion of ingredients will have only a modest effect on the resistivity, temperature range and sensitivity of the resulting materials. These variations can be accommodated in accordance with the present invention since there is unparalleled control of the geometry and resistance of the pieces of the ingot. As the properties vary from boule to boule or even from piece to piece, the geometry and/or the resistance of the pieces from that boule can be adjusted to compensate, just by cutting more or less material form one or more surfaces of each piece. The end result may by chips of slightly different size, but nearly identical electrical properties. This flexibility allows one to realistically compensate for normal process variation.

Ingots can be grown in a number of ways such as those described in the aforementioned Pierret and Kingery references. However, as underscored by Yorizumi, Yokoyama & Takahashi "Single Crystals of Ferrite Grown By The Floating-Zone (FZ) Method" published in *Advances in Ceramics,* Vol. 16 presented at the Fourth International Conference On Ferrites, Part I edited by Franklin F. Y. Wang, State University of New York at Stoney Brook, Stoney Brook, N.Y. for the American Ceramic Society, Inc. of Columbus, Ohio pages 521–525, the text of which is hereby incorporated by reference, the production of single crystals of oxides requires some different considerations then growing typical semiconductive ingots. For one thing, the operating temperatures used are often considerably higher. Moreover, typical semiconductors are usually grown in an inert or reducing atmosphere, whereas spinels are grown in air, an enriched oxygen atmosphere, or in oxygen mixed with gases such as nitrogen or argon and at elevated pressure (greater than 1 to about 15 atmosphere, more preferably up to about 10 atmospheres. Each substance requires a suitable atmosphere under which it is stable. One way in which suitable ingots can be grown is by the use of a modified floating zone procedure as discussed by Yorizumi et al., and as illustrated by the apparatus shown in FIG. 1.

The apparatus is constructed from a high pressure chamber 1, a working coil 2 attached to a high frequency generator (not shown), a subsidiary heater 3, and sample holders 4 and 5, each equipped with manipulation means (not shown). In the primary process of crystal growth, the seed crystal 6, prepared with a lower electrical resistivity than that of the sintered feed rod 7, is heated by the working coil 2 as is the feed rod 7. The seed crystal 6 can be grown using, for example, a flux.

Molten zone 8, six to seven millimeters deep, is formed between the seed crystal 6 and the feed rod 7. The seed crystal 6 and the feed rod 7 are gradually moved though the heater such that the when the molten zone 8 contacts the seed crystal 6, that localized portion of the molten zone 8 is allowed to begin cooling and re-crystallizing. The seed crystal 6 and the feed rod 7 are rotated (10 to 30 rpm) and moved down at a rate of 10 to 30 millimeters per hour in a mixed atmosphere of oxygen and argon gas ranging from 10 to 50 atmospheres total pressure. The temperature of the growing crystal 9 is kept at a temperature which promotes crystal growth in the particular crystal system by the subsidiary heater 3. After growth is completed, the atmosphere is replaced by pure argon and the crystal 9 is then slowly cooled to room temperature for over a long period of, for example, 40 hours, using the subsidiary heater in an argon atmosphere. The result is an ingot of material from which pieces can be made.

Ingots may also be made by other techniques such as flux methods or by, for example, the Bridgman method. As to the latter, it was observed in 1925 that when a molten metal in a narrow tube was carefully cooled a few single crystals were usually produced. These seeds were differently oriented and because growth rate depends on crystallographic directions, one of the seeds grew ahead of the others and squeezed aside all competitors. This behavior is the basis of the Bridgman method. Many devices following this method have been developed. Specifically, a furnace is provided with two chambers, one above the other, each with its own temperature control. The substance to be melted is placed in a cylindrical platinum crucible with a bottom formed in the shape of a cone and melted in the upper chamber. The temperature of the lower chamber is adjusted to a proper value. The crucible containing the melt is lowered slowly from the upper chamber into the lower chamber. A temperature gradient is found between the two chambers which is related to the lowering speed. In a successful operation one seed will emerge from the conical tip of the crucible and proceed to grow upward through the melt as the crucible is lowered from the upper chamber, held at a temperature above the melting point of the desired crystal, into the lower chamber maintained at a temperature below the melting point. See Bridgman, P. W., *Proc. Am. Acad. Arts Sci.* 60, 308(1925); Stockbarger, D.C., *Rev. Sci. Instr.* 7, 133–6 (1936); and Wickham, D. G., Thesis, M.I.T., 1954.

It is preferred that the ingot have a diameter which is at least about two centimeters, more preferably, the ingot has a diameter of at least about 1 cm and preferably about 2.5 centimeters. Even most preferably, a diameter of greater than 5 centimeters will be used. The use of the term "diameter" herein is meant to describe the shortest line drawn through the center of an object such as a circle, square or triangle. The ingot is often substantially cylindrical, but it need not have a circular cross-sectional area.

Next, the ingot is sliced using a diamond edged saw, laser or other suitable device or chemical. The piece cut from the ingot, usually a slice or wafer, is sliced to a thickness related to the device geometry and electrical properties, such as resistance. A spinel's chemical composition and crystal structure determine its Resistivity-Temperature characteristic. The device geometry sets the range of resistance values over the specified temperature range since the resistance is a function of resistivity and geometry.

The geometry of the wafer, bar or chip will vary with a number of factors. Obviously, it will depend upon the composition and crystalline structure of the material used. A cubic spinel of one material may behave differently in terms of its temperature sensing properties than another structure of the same elements. A chip made from a boule of a cubic spinel of nickel-manganese oxide will have different electrical properties than a boule produced from a cubic spinel of a nickel-manganese-cobalt oxide. Accordingly, adjustments will have to be made to accommodate the various compositions used.

The electrical properties of the pieces cut from the boule can be further adjusted by polishing or surface treating. For example in further processing a piece by polishing, some material may be removed and this will generally change the overall resistance of the piece. In a similar fashion, grinding one or more surfaces of the wafer will also reduce the amount of material and, therefore, alter the resistance. Material can also be trimmed or cut from the piece to alter resistance further. Obviously, cutting the piece into a number of smaller chips by using a saw, laser or other device to divide the wafer along cut lines which are perpendicular to the major planar surface will also change the resistance of each resulting piece, as well as the geometry thereof. It is also possible to treat at least one of the major planar surface of the wafer, slice, bar or chip by cleaning, heating, drying, grinding, polishing, etching, doping, lapping, and/or coating same before adding contacts.

Terminals or contacts (used interchangeably herein) can be created by techniques similar to those utilized to form contacts on semiconductor chips. Thus, a metal suitable for forming an ohmic contact with the spinel material is placed in the spots where the terminals are desired. Among the metals which can be used to form ohmic contacts with typical spinels are noble metals and their alloys, copper, and aluminum and their alloys. Platinum, palladium and gold, and their alloys are particularly preferred. Further metals can be added over the ohmic contact metals to provide thicker, raised terminals commonly referred to as "bumps" projecting above the plane of the wafer surface. The further metals can be the same as or different from the ohmic contact metals, and can be selected for compatibility with bonding processes such as soldering, thermosonic bonding or wire bonding.

Among the process steps which can be used to place the metals in the desired spots are techniques such as vapor deposition, sputtering, chemical vapor deposition, plasma enhanced chemical vapor deposition, electroless plating and electroplating. Among these techniques, vapor phase techniques such as sputter, vapor deposition, chemical vapor deposition and plasma enhanced chemical vapor deposition are preferred, because they do not expose the spinel wafer to potentially contaminating liquid solutions. Selective placement of the metal in only the desired locations on the wafer surface can be achieved either by applying the metal selectively or by applying the metal nonselectively, over the entire surface of the wafer, and then etching away the undesired portions. In either case, conventional photoresists of the types used in semiconductor processing can be employed. Such photoresists can be used by applying a layer of the photoresist and exposing the resist layer to illumination in a pattern corresponding to a positive or negative image of the areas to be covered by the resist during processing, followed by a washing step to remove either the exposed or unexposed areas. The remaining areas may mask areas to be left untreated in an etching step, or areas to be left free of metal during a deposition step such as sputtering. After the etching or deposition step is completed, the resist layer is removed, as by exposure to a solvent or by ashing.

The formation of terminals using these patterning processes can provide extraordinary accuracy in the sizes and shapes of the terminals, and in the distances between terminals. Thus, tolerances in the micron range are readily achievable. This helps to provide reproducibility among the many sensors produced from a single wafer and among all of the sensors produced according to a common design.

Figure 2:
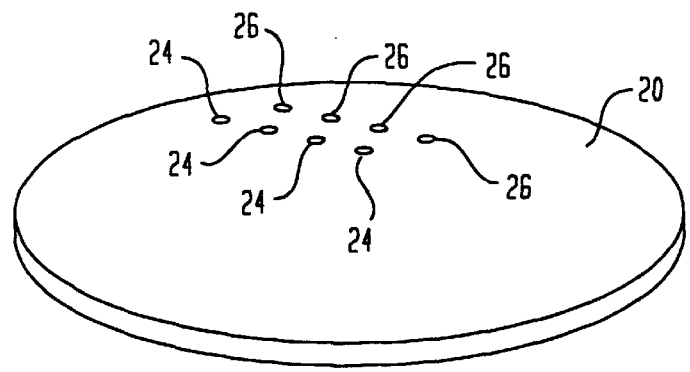
FIG. 2 is a top Planar view of a wafer sliced from an ingot including a plurality of pairs of terminals.

Generally, a single wafer 20 which is cut from an ingot and has a major planar surface 22 and a thickness can be used to produce a plurality of individual thermistor chips. See FIG. 2. Therefore, more often than not, a plurality of pairs of terminals (24,26) are attached to a surface of the wafer in an array extending over essentially the entire useful area of the wafer. Each pair of terminals is arranged such that, after the wafer 20 is cut into chips, each chip will have one pair of terminals (24,26) spaced apart from one another. The spacing between the terminals of each pair corresponds to the desired distance between terminals in the finished thermistors. Of course, terminals can also be attached to each chip after it has been cut from a wafer as well.

Figure 3:
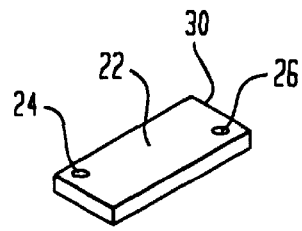
FIG. 3 is a perspective view of a chip produced from the wafer of FIG. 2.

As previously noted, the slice cut from the ingot can be cut into smaller pieces or chips 30 as shown in FIG. 3 by cutting the wafer perpendicularly to the major planar surface using a saw or laser of the type commonly used in "dicing" semiconductor wafers. After "dicing," each individual thermistor can be mounted on a substrate or in a housing such as a ceramic or polymeric circuit panel having circuits or connectors such as pins or leads for connecting the thermistor to a larger electronic circuit. The individual terminals of the thermistor can be connected to terminals of the substrate by leads using a wire bonding process in which lengths of fine gold or other wire are bonded to the terminals; by a tape automated bonding process using a preformed flexible tape with leads thereon and thermosonically bonding the leads of the tape to the terminals of the thermistor; or by other processes used to form interconnections to semiconductor chips. The assembly including the thermistor and substrate may be enclosed in a protective casing, as by "potting" the assembly in a polymeric composition such as an epoxy or a silicone, or by placing the assembly into a hollow housing.

In the mass production of sensors, it may be necessary to adjust to variations in the composition of the boule. Adjustments may be made by the electronics used. Preferably, however, each chip produced from each boule will have, for example, a resistance which fits a very tight production specification. This can be accomplished in accordance with the present invention by determining the resistivity of the boule, predetermining the resistance desired and changing the geometry of the chip, and therefore the size of the slice and/or cuts made in producing the chips. There will, of course be boundaries set on size. If the sensor is too big, it may not fit in the needed application. Smaller is generally not a problem. Within those conditions, adjustments can be made on a boule by boule basis to produce devices with nearly identical electrical characteristics.

Figure 5:
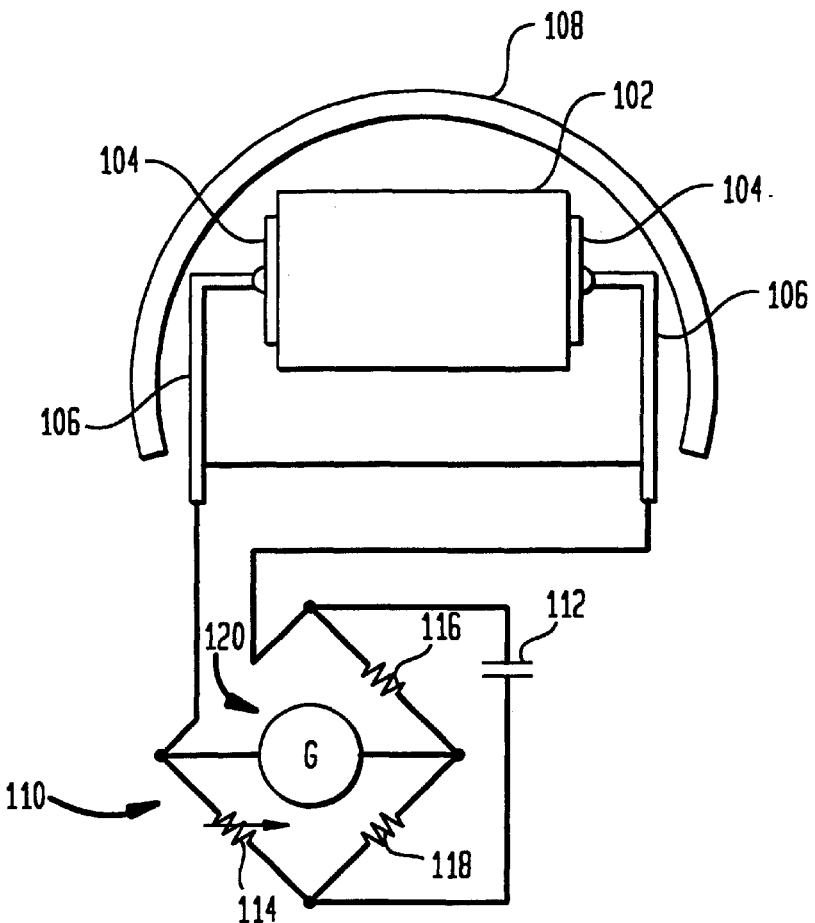
FIG. 5 is a diagrammatic view depicting a sensor in accordance with an embodiment of the invention.

The resulting sensor can be attached to an electrical circuit and used as a sensor or a thermistor. A sensor or thermistor in accordance with a further embodiment of the invention includes a sensing element 102 (FIG. 5) consisting of a monocrystalline nickel-cobalt-manganese oxide spinel made in accordance with the above-described embodiments of the invention, and a pair of electrical terminals 104 in substantially ohmic contact with the sensing element. Terminals 104 can be formed from noble metals and their alloys, copper, and aluminum and their alloys. Platinum, palladium and gold, and their alloys are particularly preferred. The metallic terminals can be applied by sputtering the metal of the terminal onto the spinel, or by electroplating, electroless plating, painting with a metallic paint or pressurized contact so that the metal of the terminal is in intimate contact with the spinel. Leads 106 are connected to the terminals by welding or soldering. Sensing element 102, contacts 104 and leads 106 are enclosed in a conventional housing 108, of which only a portion is illustrated in FIG. 5.

Figure 6:
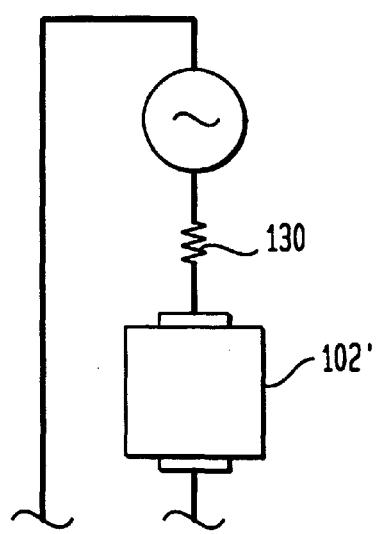
FIG. 6 is a diagrammatic view depicting an electrical circuit in accordance with the invention.

Leads 106, and hence the sensing element, are connected to an electrical resistance measuring device 110 adapted to measure the electrical resistance through the sensing element. The particular resistance-measuring device illustrated in FIGS. 5–6 is a Wheatstone bridge, incorporating a battery 112; a variable resistor 114 in series with the sensing element to form one branch; resistors 116 and 118 connected in series with one another to form another branch in parallel with the first branch and a galvanometer 120 connected between the branches. The circuit can be used to measure an unknown temperature by exposing the housing 108, and hence sensing element 102, to the unknown temperature, and adjusting resistor 114 until the bridge is in balance, whereupon galvanometer 120 shows no current flow. The resistance required to bring the bridge into balance is a measure of the resistance through the sensing element, and hence a measure of the unknown temperature. Many other conventional resistance-measuring instruments can be used in place of the Wheatstone bridge. For example, a conventional ohmmeter can be employed.

The sensing element can also be used to provide temperature compensation in an electrical circuit. For example, an electronic circuit may include resistor 130 connected in series with sensing element 102' similar to the sensing element discussed above, and further connected to other circuit components (not shown). When the circuit is exposed to changes in ambient temperature, the resistance of resistor 130 tends to increase with increasing temperature. The decrease in resistance of sensing element 106' compensates for such increase. The variation in impedance of the sensing element with temperature can be used to compensate for changes in properties of other electronic components, such as semiconductors, devices, capacitors, inductors and the like. Sensing elements according to this aspect of the invention are particularly useful in circuits driven with alternating currents above about 10 Hz, and even more useful at higher frequencies. In contrast to polycrystalline sensors, the sensors according to this aspect of the invention have substantially lower dispersion or change in impedance with frequency than polycrystalline sensing elements. Thermistors can operate between at least −63 to 260° C., see generally the 1993 Thermometrics' Catalog, entitled "Worldwide Capability in Thermistors". A wider range will be available with doping.

One of the problems associated with this type of production method is the need for an objective way to evaluate the quality of the resulting boule or ingot as well as any pieces, i.e., chips, wafers, bars or other structures produced therefrom. The boule, for example, can include contamination from the flux, stress fractures, cracks, inclusions and the like which would be difficult to identify visually. Microscopic or x-ray analysis could be utilized. However, such analyses can be expensive and time consuming. In addition, some forms of analyses may require destruction of the sample. It has been found, however, that by the use of impedance spectroscopy, it is possible to analyze these materials quickly and efficiently to determine its quality. The same technique can also be used to evaluate the contact interface, i.e., measuring how well contacts or terminals have been adhered to the surface of the resulting thermistor.

Impedance spectroscopy has traditionally been used to determine various properties of polycrystalline materials. However, it is not believed that the technique has been used in connection with complex metal oxide monocrystals, even for determining traditional information such as impedance, resistivity, resistance and the like. It has also not been previously used to evaluate the quality of a monocrystal or pieces cut therefrom.

Figure 11:
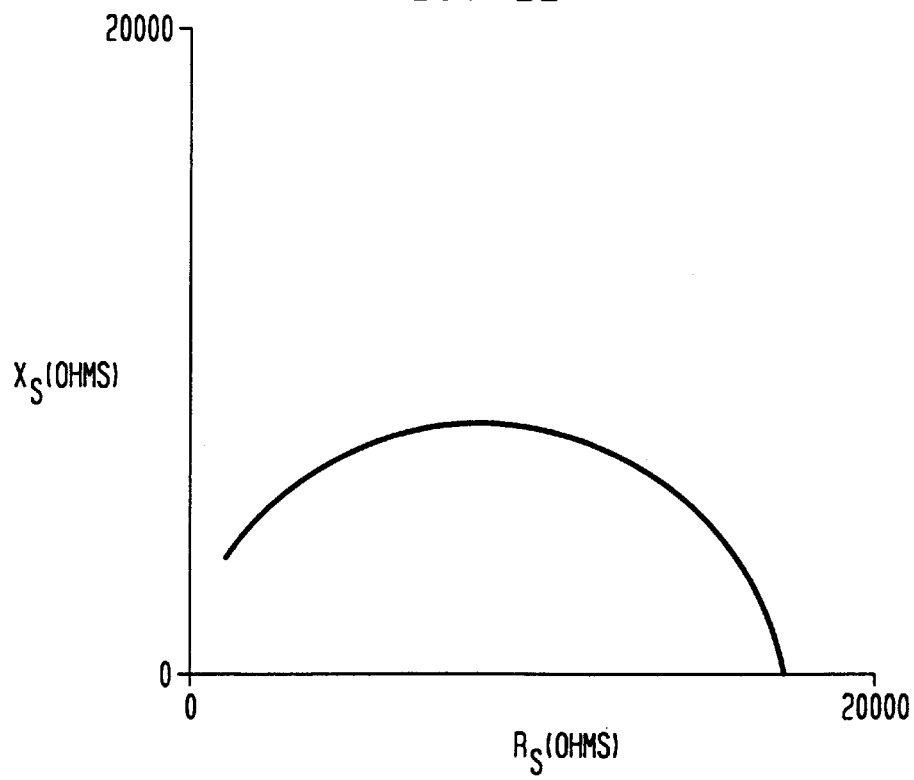
FIG. 11 is an impedance spectrum of a monocrystalline nickel manganese oxide cubic spinel thermistor.

Generally, the technique of impedance spectroscopy consists of measuring the resistance (R) and the reactance (X) at various frequencies of an applied AC voltage. Since the reactance depends on the capacitance of the piece, imperfections and contact resistances show up as increased reactance at lower frequencies. When the negative of the reactance is plotted versus the Resistance for all of the measured frequencies, a series of semicircles is obtained whose centers lie below the horizontal axis. As shown in FIG. 11, when a monocrystalline boule, or a chip produced therefrom, is tested by impedance analysis in this way, the resulting spectrum is a single semicircle. This indicates that all of the impedance of the system comes from the monocrystalline material.

Figure 12:
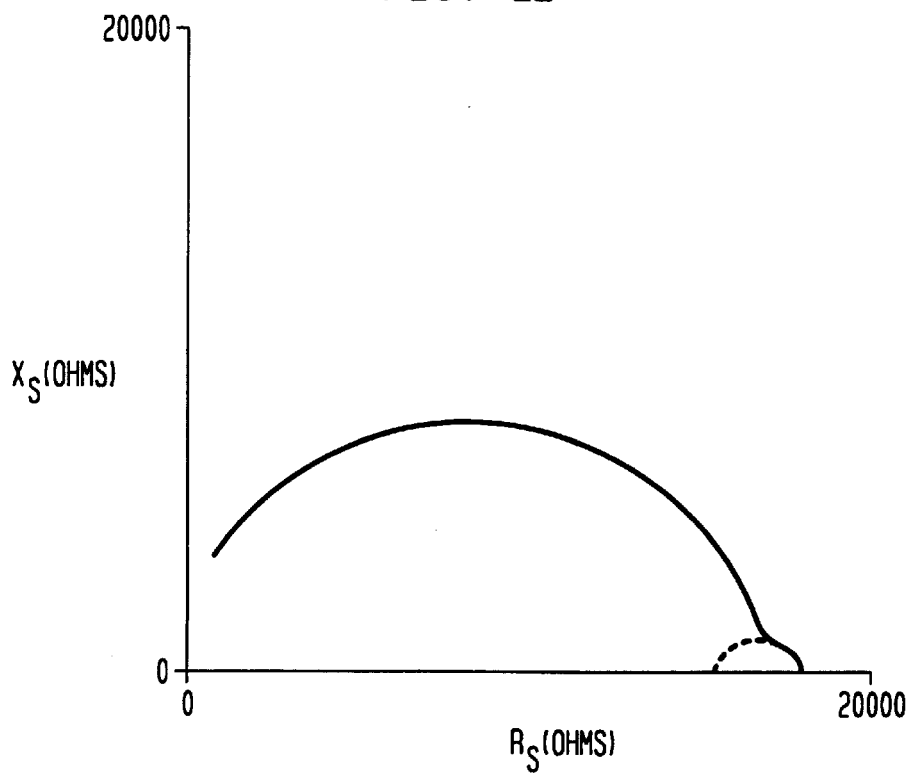
FIG. 12 is an impedance spectrum of a monocrystalline nickel manganese oxide cubic spinel thermistor, having an imperfection at an edge.

However, when a crystal containing an inclusion or imperfection such as a chip, crack or fracture was analyzed by impedance spectroscopy, as illustrated in FIG. 12, the result was something which more closely approximated the spectrum of a polycrystalline material, than that which results from a monocrystalline material. The spectrum exhibited a second semicircle. Without wishing to be bound by any particular theory of operation, it is believed that the imperfections in the crystal contribute their own impedance, i.e., their own component to the total impedance. Therefore, this technique can be used diagnostically to determine the structural integrity of the monocrystal. A similar result is realized when there are problems with the contacts.

Some additional properties of the material can also be obtained from this technique (e.g. distributions of relaxation times) and similar analyses can be done using dielectric constant, loss tangent, and Debye dispersion relations. A textbook on the topic is: "Impedance Spectroscopy: Emphasizing Solid Materials and Systems:. J. Ross Macdonald ed., John Wiley & Sons, Inc. 1987. See also "Electroceramics: Characterization by Impedance Spectroscopy", by John T. S. Irvine, Derek C. Sinclair, and Anthony R. West, in Advanced Materials 2 (1990) Np. 3 pp. 132–138, the text of which is hereby incorporated by reference.

The present invention therefore allows one to produce a boule, slice it into wafers, produce thermistors and evaluate whether the boule and/or the wafers and/or the thermistors are properly formed, free from defects, and whether or not contacts have properly been attached. Accordingly, impedance analysis can be a very important method of quality control when used in the production of thermistors in accordance with the present invention. The use of impedance analysis may take place after the boule is grown, after slices are produced from the boule and/or as a method of analyzing individual chips before and/or after contacts are applied. Moreover, depending upon the placement of the electrodes, it is possible to merely analyze portions of the boule, one at a time. This is useful for locating the source of any imperfections so that the can be removed. In a preferred method in accordance with the present invention, impedance analysis may be attempted at a plurality of times throughout the production process. Sampling of chips produced in accordance with the present invention by normal statistical quality control models may also be advantageous and impedance analysis is a quick and effective device to be used as part of that quality control program.

EXAMPLE 1

Monocrystals of nickel-cobalt-manganese oxide having a cubic spinel structure were grown in solutions of molten mixtures of bismuth and boron oxides (flux) as follows: 6.102 gms $Co_3O_4$, 3.083 gms NiO, 9.899 gms $Mn_2O_3$, 5.556 gms $B_2O_3$ and 158.519 gms Bi2O3. These materials were charged to a 50 ml platinum crucible. The quantities of oxides equated to a total charge of 0.6 moles. The composition was computed for cobalt oxide (CoO) but were weighed out as $Co_3O_4$, the commercially available material. The crucible was positioned inside a six-inch diameter, six-inch high platinum crucible, and held in place by an alumina form. This platinum crucible was loosely covered by a platinum lid in order to prevent contamination. The lid was mounted in such a manner so that the equilibrium between the sample and the oxygen in the air was maintained. This covered container, along with its contents, was placed into a furnace and positioned onto a pedestal programmed to rotate clockwise and counter-clockwise to ensure mixing and equal thermal treatment. The furnace was then heated to a top temperature of 1280° C. The crucible was then soaked at that temperature for 60 hours. After soaking the crucible was cooled to a second elevated temperature, of 860° C. at a rate of −0.6° C. per hour.

At the second elevated temperature, the contents of the crucible contained crystals surrounded by liquid. When the quench temperature or second elevated temperature was attained, the crucible was quenched under a blanket of dry nitrogen gas to ambient temperature.

The contents of the crucible was cored at its center, producing a shallow cylindrical hole approximately 2 cm long and 1 cm in diameter. The core and the cored crucible was immersed in 10 volume percent acetic acid. The residual sludge was washed away and the crystals were recovered. The crystals obtained were studied by X-ray diffraction and chemically analyzed for nickel, cobalt, and manganese content. The cubic spinel lattice constants, chemical composition, and X-ray densities are were obtained presented in Table 2. The resulting crystals ranged in size from 0.4 to 1 cm along an edge.

TABLE 2

Lattice Constant Data and Chemical Composition Data along with the Calculated X-Ray Density (D) of Ternary Cubic Spinel Monocrystals Obtained From Flux Growth Method

| Lattice Constant | Chemical Composition $Ni_xCo_yMn_zO_4 = M_3O_4$ | | | X-ray Density |
| --- | --- | --- | --- | --- |
| $a_o$ (Å) | x | y | z | D [g/cm$^3$] |
| 8.3347 | 0.6120 | 0.8208 | 1.5672 | 5.3779 |

Thin plates (14×27×27 mils) were cut from monocrystals grown in crucible described above and were analyzed with a Hewlett-Packard 4192A Impedance Analyzer. The chips were cut from the ingot using a diamond saw and then soaked in 15 vol % acetic acid overnight. They were then washed with ethanol and distilled $H_2O$. The (27×27) faces were electroded with Dupont 4922N silver paint. The contacted chip was placed into a clip with two lead wires which were inserted into the test fixture of the Impedance Analyzer. Impedance-frequency spectra were obtained for sixty five frequencies ranging from 5 to 1.3×10$^7$ Hz interval at temperatures ranging from −69 to 204° C. The impedance analysis in terms of frequency (f) in Hertz, series resistance (Rs) and series capacitive reactance ($X_s$) was obtained. The ($R_s$,$X_s$) data can be converted to their parallel ($R_p$,$X_p$) equivalents. Several impedance related properties can be calculated such as resistivity (ρ) and capacitance. See Impedance Spectroscopy, Edited by J. Ross Macdonald, John Wiley and Sons (1987) and especially chapters 1 and 4 thereof which are hereby incorporated by reference.

Figure 4:
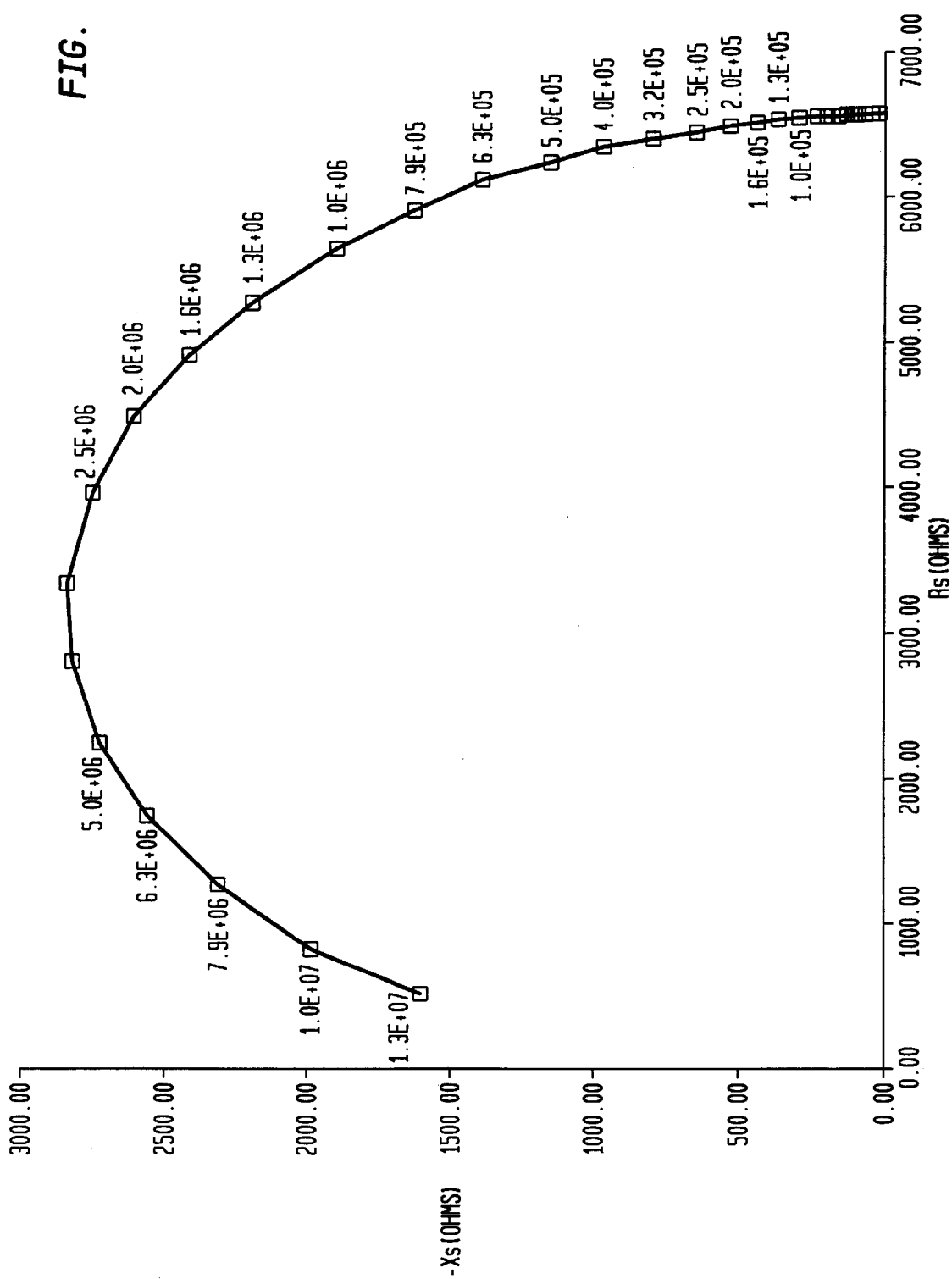
FIG. 4 is an impedance plane plot taken at −4° C. for a monocrystal thermistor cut from an ingot over the range of 5 to $1.3 \times 10^7$ Hz.

Impedance plane plots of the ($R_s$, $X_s$, f) data generated by the Hp4192A for the −4° C. isotherms are shown in FIG. 4. Sixty-five sets of (f, $R_s$, $X_s$) data were actually obtained for each isotherm. FIG. 4 shows a single semicircle indicating that the total impedance for the system comes from a single source, presumably the monocrystalline material. The fact that no other sources of impedance were detected demonstrates that the material was a single crystal, that the crystal slice was not compromised during slicing and that the contacts are properly adhered to the surfaces thereof.

Figure 7:
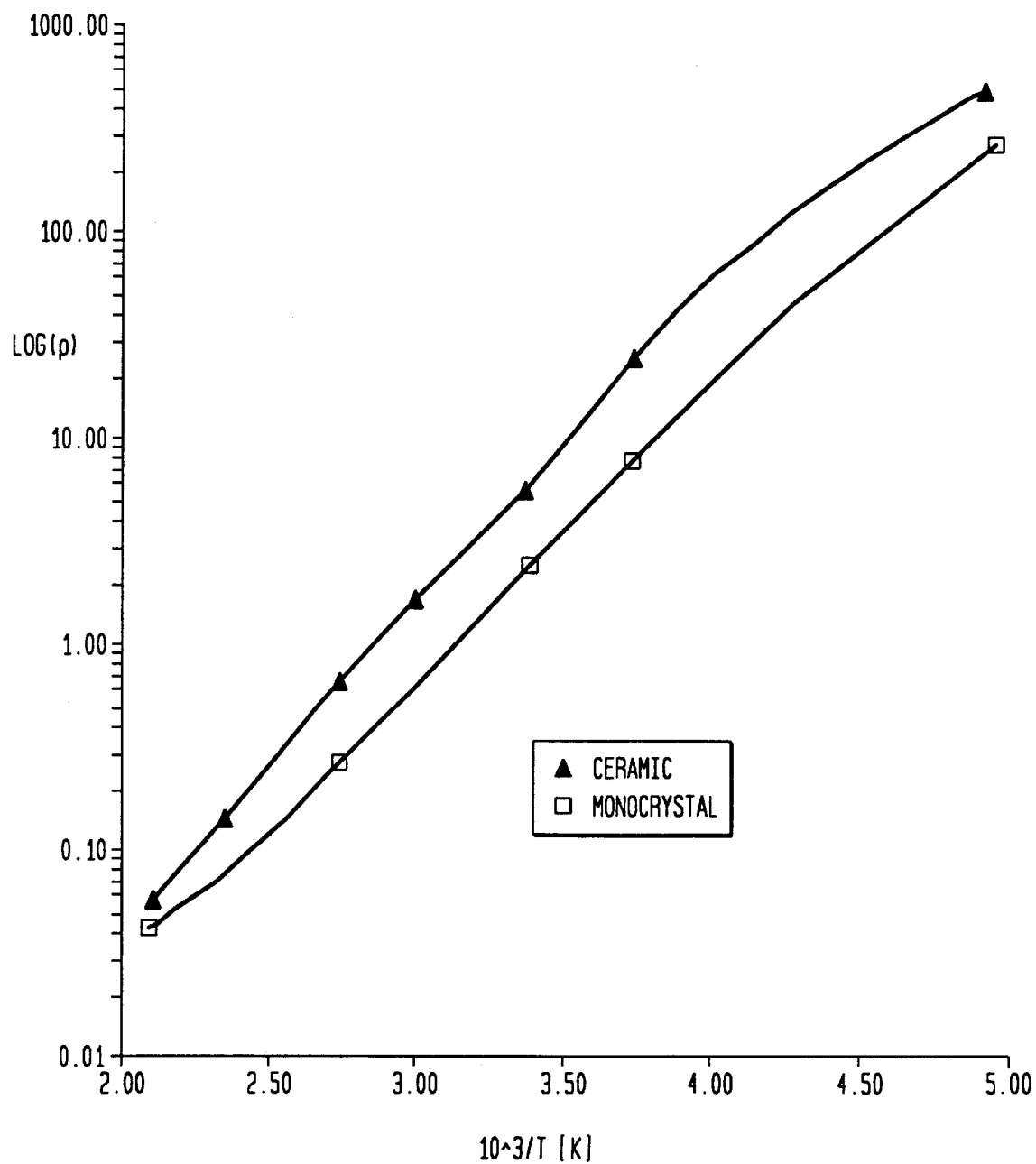
FIG. 7 is a semi-log plot of Resistivity ρ versus Inverse Temperature for a monocrystal and analogous ceramic at 5 Hz where the open square is the monocrystal and the closed triangle is a ceramic.
Figure 10:
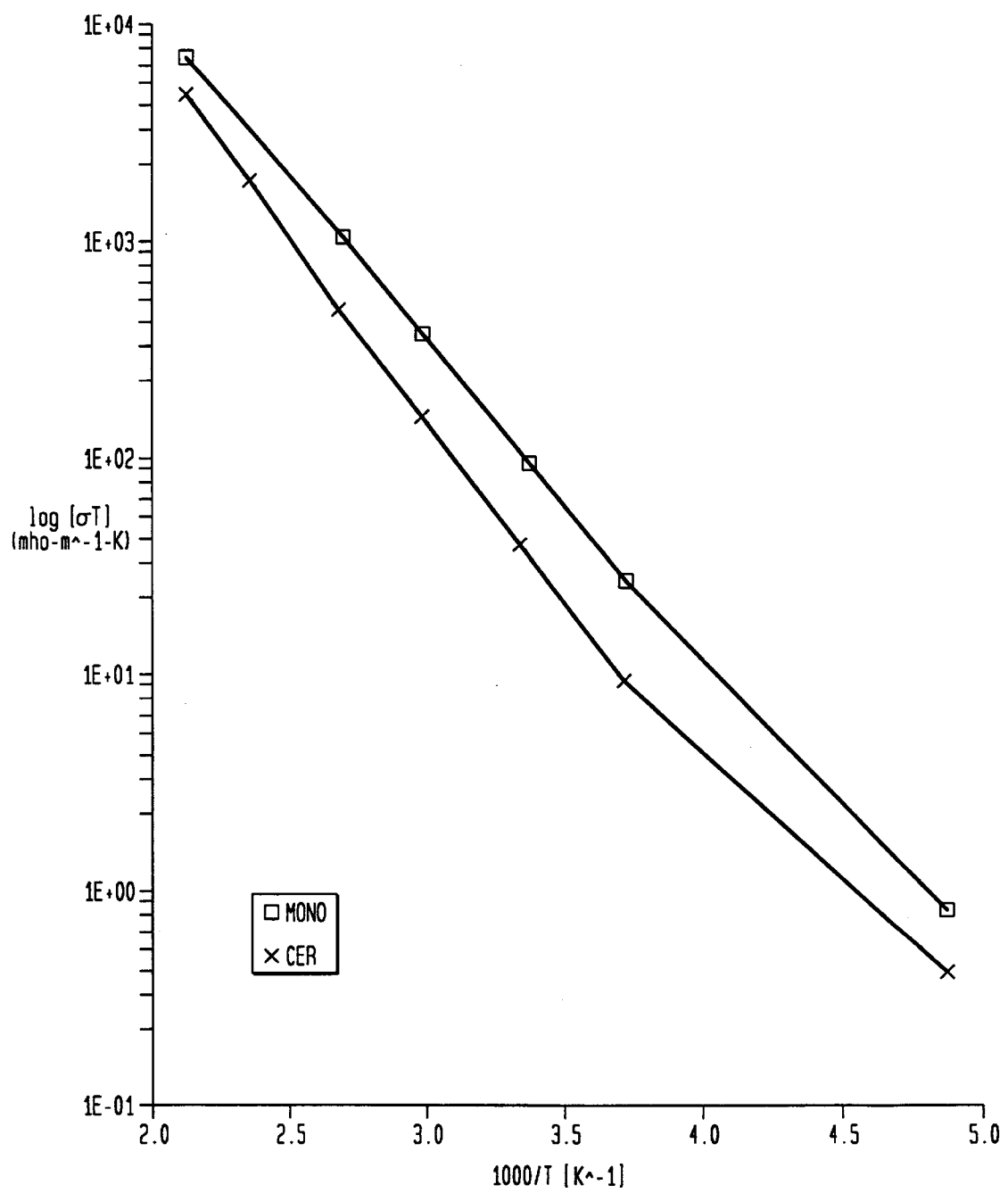
FIG. 10 are two semi-log plots of the product of [Conductivity and Temperature] versus [Inverse Temperature] for the monocrystal and ceramic taken at 5 Hertz where the monocrystal is open squares and the ceramic is an "x".

FIG. 7 is a semi-log plot of resistivity (ρ) versus inverse temperature for both the monocrystal and a ceramic material obtained from Thermometrics, U.S. Highway 1, Edison, N.J., 08817 (lot No. 062292MP-1). The change in the D.C. resistance of a material with temperature is a the property utilized by designers in developing thermistors. It is a logarithmic function described ideally by the equation:

$$\log \rho = E/2.303kT + A$$

where ρ is the resistivity, A is a numerical constant, k is the Boltzmann's constant, T is the absolute temperature (°K) and E is the activation energy for conductivity, a characteristic related to material's composition. According to the equation, a plot of log ρ against the reciprocal temperature ($1/T$) should be a straight line with a slope (E/2.303k) which permits calculation of the activation energy. This slope describes the observed decrease of resistance with increasing temperature. Typical values for activation energy are 0.28 electron volts or the equivalent 3250K. The greater the activation energy the greater the change of resistance with temperature. Imperfect materials, such as polycrystals, exhibit changes in E over narrow temperature ranges. See FIG. 10. A comparison of the plots illustrates that the monocrystal exhibits a more log-linear behavior then that exhibited by the ceramic. The low temperature region in particular shows a greater nonlinearity for the ceramic than for the monocrystal. The uniformity of the monocrystal means that thermistors produced therefrom can be calibrated from a single point rather then multiple points as would be required for thermistors made from a polycrystalline ceramic. Moreover, even with the increased calibration, the monocrystal would likely yield improved accuracy. This is a critical difference in the properties of these materials in terms of their intended use.

Figure 8B:
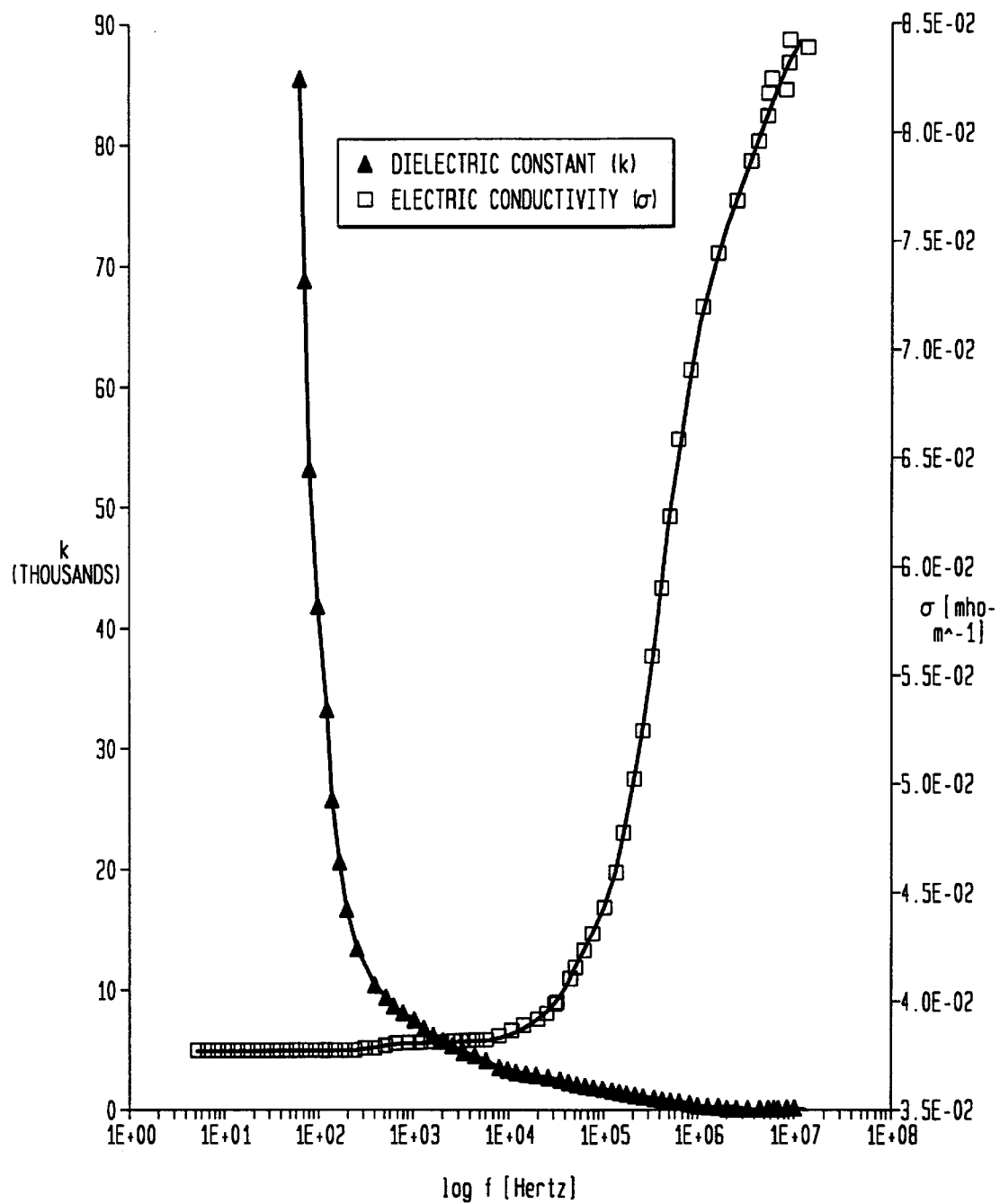
FIG. 8b is a plot of Dielectric Constant (K=ϵ/ϵ$_0$)) (closed triangles) and Electric Conductivity (σ) (open squares) [mho-m$^{-1}$] versus log Frequency [Hertz] for the ceramic at −4° C.

FIGS. 8a and 8b illustrate the behavior of the monocrystal and ceramic materials identified above, respectively, in terms of conductivity (Open Squares) and dielectric constant (Closed Triangles). As shown in FIG. 8a, the conductivity of the monocrystal is very constant between about 5 Hz (DC current) and about 1×10$^5$ Hz. In contrast, the ceramic shows a constant conductivity only to about 1×10$^3$ Hz. In addition, the conductivity of the monocrystal in general is higher then that of the polycrystal. Finally, the dielectric constant of the monocrystal appears of be linear and constant between about 1×10$^2$ and 1×10$^7$ Hz while the ceramic is constant only between about 1×10$^6$ and 1×10$^7$ Hz.

Figure 9A:
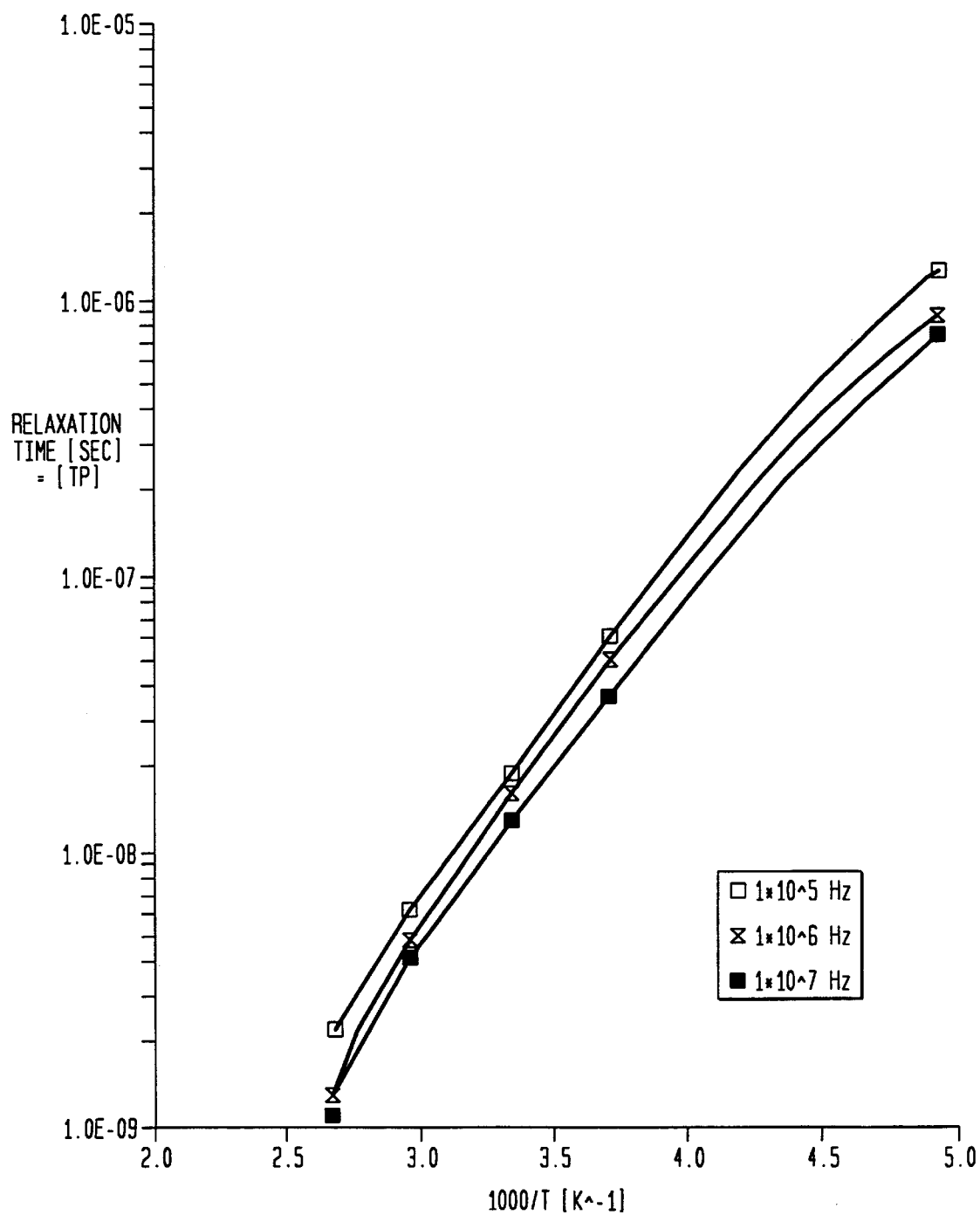
FIG. 9a are constant frequency semi-log plots of Relaxation Time ($\tau_p$) versus Inverse Temperature for the monocrystal wherein the open squares are at $1 \times 10^5$ Hz, the hourglass is $1 \times 10^6$ Hz and the closed squares are at $1 \times 10^7$ Hz.
Figure 9B:
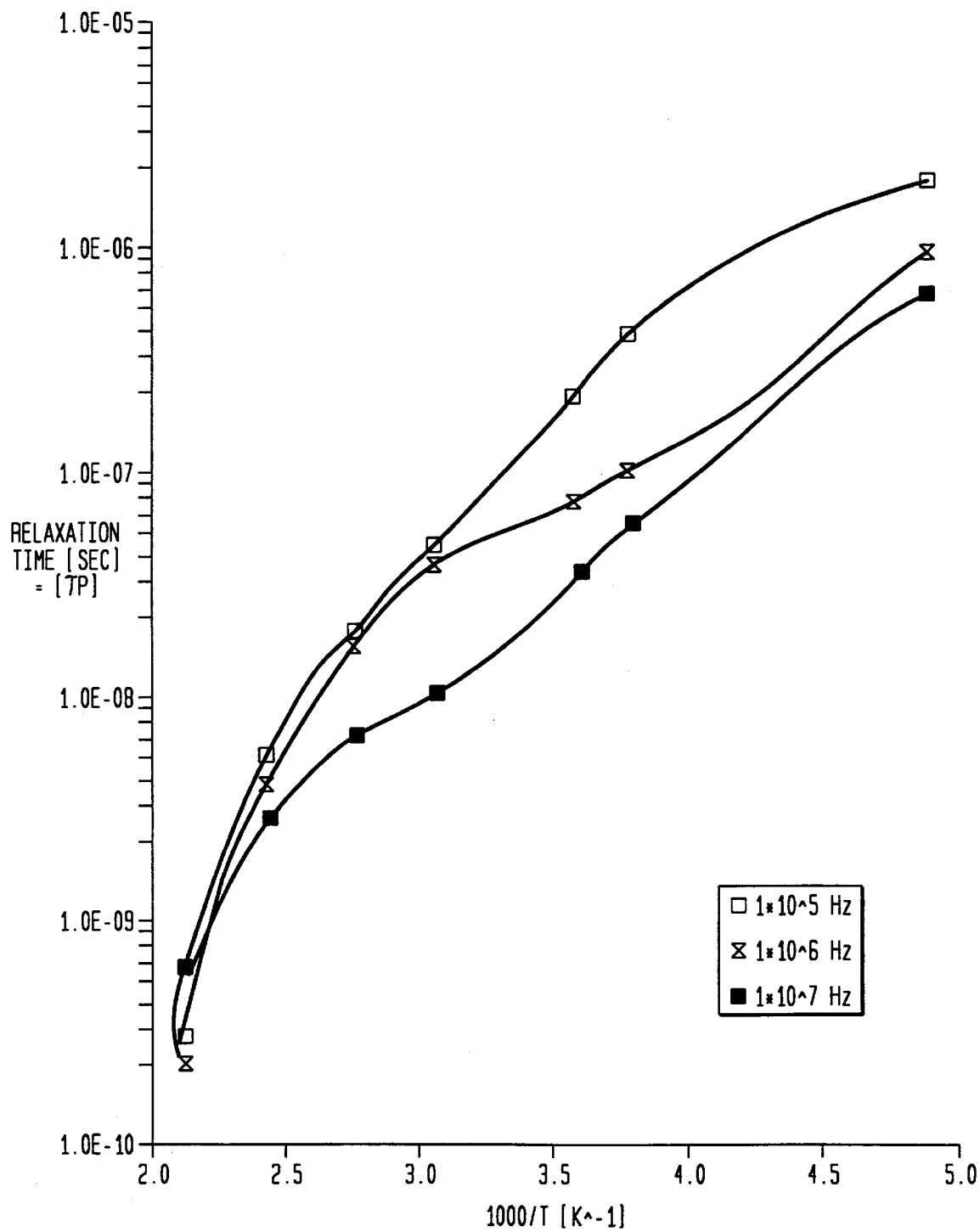
FIG. 9b are constant frequency semi-log plots of Relaxation Time ($\tau_p$) versus Inverse Temperature for the ceramic wherein the open squares are at $1 \times 10^5$ Hz, the hourglass is $1 \times 10^6$ Hz and the closed squares are at $1 \times 10^7$ Hz.

FIGS. 9a and 9b are constant frequency plots of log $\tau_t$ versus inverse temperature for the monocrystal and ceramic, respectively. This is a measure of relaxation time. The plots illustrate the relaxation time of the monocrystal verses the ceramic. Relaxation time describes an electrical response to a change of voltage in an A.C. circuit. As demonstrated in the figures, in addition to systematically faster relaxation times ($\tau_p$) across the entire temperature range for each constant frequency curve, greater uniformity in the slope for the monocrystal as opposed to the ceramic was observed.

EXAMPLE 2

A contacted chip was prepared as described in Example 1. However, the boule was composed of nickel manganese oxide cubic spinel and was produced from the following material charged to an approximately 200 ml platinum crucible: 26.8470 g $B_2O_3$ (11.4 mol %), 765.587 g $Bi_2O_3$ (48.6 mol %), 50.516 g NiO (20 mol %) and 106.767 g $Mn_2O_3$ (20 mol %). The crucible was cooled at a rate of 1° C./hour. The resulting 27×27×14 mil chip was put in a clip with two lead wires which are inserted into the test fixture of the Hewlett-Packard 4192A Low Frequency Impedance analyzer. The analyzer is computer-driven to measure the series Resistance and Series Reactance at 65 different frequencies from 5 Hertz to 13 Megahertz. Typically 25 m Volt is the amplitude of the applied AC voltage, and normally applied DC is not used.

The thermistor was controlled at room temperature, and run under computer control to measure R and X at the 65 frequencies. The raw data is printed out and then the X vs R plots are generated. See FIGS. 11 and 12. The equivalent Capacitance(s) were calculated and the determination was made whether the Impedance was due solely to the bulk material. The perfect single crystal material showed a single semicircle. See FIG. 11. However, a chip having a small imperfection at one edge showed an extra semicircle in the lower right hand side demonstrating electrical properties different from the bulk. See FIG. 12.

What is claimed is:

1. A method of producing a sensor from a monocrystal of a metal oxide comprising the steps of: providing an ingot of monocrystalline metal oxide; slicing said ingot into a plurality of pieces, at least two of said pieces, each having at least one edge of a predetermined thickness and at least one major planar surface having an area, said thickness and said area being selected to provide said pieces with at least a predetermined resistance; attaching at least one first terminal to each of said pieces and at least one second terminal to each of said pieces at locations spaced apart from each of said first terminals, cutting each of said pieces along a plane perpendicular to said major planar surfaces, thus forming chips from each of said pieces, at least a plurality of said chips including a first terminal and a second terminal spaced apart from said first terminal.

2. The method of claim 1, further comprising the step of changing the resistance of said pieces by reducing either said thickness or said area of said major planar surfaces of said pieces.

3. The method of claim 2, wherein said step of changing the resistance of said pieces is accomplished by reducing said thickness of said pieces.

4. The method of claim 2, wherein said step of changing the resistance of said pieces is accomplished by reducing said area of said major planar surfaces of said pieces.

5. The method of claim 1, wherein said monocrystalline material has a spinel geometry.

6. The method of claim 1 when said monocrystalline material has a rock salt geometry.

7. The method of claim 2, wherein said monocrystalline material has a cubic spinel structure.

8. The method of claim 2, further comprising the step of attaching a plurality of pairs of terminals to said pieces, said pairs of terminals being spaced apart from one another by a predetermined distance which is sufficient to allow said pieces to be cut along a plane perpendicular to said major planar surfaces, thus forming a plurality of chips, each containing at least one of said pairs of terminals.

9. The method of claim 8, further comprising the step of cutting said pieces along a plane perpendicular to said major planar surfaces, thus forming a plurality of chips, each containing at least one of said pairs of terminals.

10. The method of claim 1, wherein said ingot has a diameter of at least about 2 cm.

11. The method of claim 10, wherein said ingot has a diameter of at least about 2.5 cm.

12. The method of claim 11, wherein said ingot has a diameter of at least about 5 cm.

13. The method of claim 1, further comprising the step of producing said ingot in an oxygen containing atmosphere.

14. The method of claim 13, further comprising the step of producing said ingot at temperature of at least about 600° C.

15. The method of claim 14, wherein said temperature ranges from between about 700 and about 1400° C.

16. The method of claim 1, further comprising treating at least a first surface of said pieces by a method selected from the group consisting of cleaning, heating, drying, grinding, polishing, etching, lapping, and coating.

* * * * *

UNITED STATES PATENT AND TRADEMARK OFFICE
CERTIFICATE OF CORRECTION

PATENT NO. : 6,125,529　　　　　　　　　　　　　　　　Page 1 of 2

DATED : October 3, 2000

INVENTOR(S) : Rosen et al.

It is certified that error appears in the above-identified patent and that said Letters Patent is hereby corrected as shown below:

Column 1, line 4, delete "of".
Column 1, line 24, delete "have".
Column 2, line 4, "III-VI" should read --II-VI--.
Column 2, line 11, "are" should read --is--.
Column 2, line 36, "oxide can" should read --oxide, can--.
Column 4, line 2, "of" should read --or--.
Column 4, line 26, "an" should read --a--.
Column 6, line 43, delete "the".
Column 9, line 4, "by" should read --be--.
Column 9, line 19, "then" should read --than--.
Column 9, line 27, "atmospheres. Each" should read --atmospheres). Each--.
Column 10, line 62, "surface" should read --surfaces--.
Column 11, line 9, "terminals commonly" should read --terminals, commonly--.
Column 11, line 9, ""bumps"" should read --"bumps,"--.
Column 11, line 39, "ashing" should read --washing--.
Column 14, line 47, "Bi2O3" should read --$Bi_2O_3$--.
Column 15, line 4, "was" should read --were--.
Column 15, line 12, "are were obtained" should read --that were obtained are--.
Column 15, line 28, after "in" insert --the--.
Column 15, line 61, "is a the" should read --is the--.

UNITED STATES PATENT AND TRADEMARK OFFICE
CERTIFICATE OF CORRECTION

| | | |
|---|---|---|
| PATENT NO. | : | 6,125,529 |
| DATED | : | October 3, 2000 |
| INVENTOR(S) | : | Rosen et al. |

It is certified that error appears in the above-identified patent and that said Letters Patent is hereby corrected as shown below:

Column 16, line 2, after "related to" insert --the--.
Column 16, line 13, "then" should read --than--.
Column 16, line 18, "then" should read --than--.
Column 16, line 31, "then" should read --than--.
Column 16, line 33, "of" should read --to--.
Column 16, line 36, "$\tau_t$" should read --$\tau_p$--.
Column 18, line 25, before "temperature" insert --a--.

Signed and Sealed this

Fifteenth Day of May, 2001

*Attest:*

NICHOLAS P. GODICI

*Attesting Officer*   *Acting Director of the United States Patent and Trademark Office*